United States Patent [19]

EerNisse et al.

[11] Patent Number: 5,022,130
[45] Date of Patent: Jun. 11, 1991

[54] METHOD OF MANUFACTURING CRYSTAL RESONATORS HAVING LOW ACCELERATION SENSITIVITY

[75] Inventors: Errol P. EerNisse, Salt Lake City; Roger W. Ward, Park City; O. Lew Wood, Murray, all of Utah

[73] Assignee: Quartztronics, Inc., Salt Lake City, Utah

[21] Appl. No.: 456,554

[22] Filed: Dec. 26, 1989

Related U.S. Application Data

[60] Division of Ser. No. 218,282, Jul. 13, 1988, Pat. No. 4,935,658, which is a continuation-in-part of Ser. No. 103,670, Oct. 2, 1987, Pat. No. 4,837,475.

[51] Int. Cl.$^5$ .............................................. H01L 41/22
[52] U.S. Cl. ..................................... 29/25.35; 29/593; 310/312
[58] Field of Search ............... 29/25.35, 593; 310/312, 310/365, 367, 369

[56] References Cited

U.S. PATENT DOCUMENTS

| | | | |
|---|---|---|---|
| 4,211,947 | 7/1980 | Ikeno et al. | 310/312 |
| 4,262,227 | 4/1981 | Ikeno et al. | 310/312 |
| 4,370,584 | 1/1983 | Ikeno et al. | 310/312 X |
| 4,418,299 | 11/1983 | Momosaki | 360/312 X |
| 4,641,055 | 2/1987 | Tanaka | 310/312 X |
| 4,642,505 | 2/1987 | Arranitis | 310/312 |

FOREIGN PATENT DOCUMENTS

| | | | |
|---|---|---|---|
| 2828048 | 1/1979 | Fed. Rep. of Germany | 310/312 |
| 204582 | 11/1983 | Fed. Rep. of Germany | 310/312 |
| 0160213 | 8/1985 | Japan | 310/312 |

Primary Examiner—Carl E. Hall
Attorney, Agent, or Firm—Thorpe, North & Western

[57] ABSTRACT

In a process of producing crystal resonators in which the direction and magnitude of the gamma vector is substantially the same for each resonator, a method of altering the resonator during the process to change the resonator mass, shape, or electrode placement so as to reduce the gamma vector magnitude of each crystal. This alteration may be done by adding mass, removing mass, or both adding and removing mass, or by positioning the electrodes to selectively position the electric field in the crystal, all in order to move the location of the active region of vibration and thereby reduce the gamma vector.

18 Claims, 3 Drawing Sheets

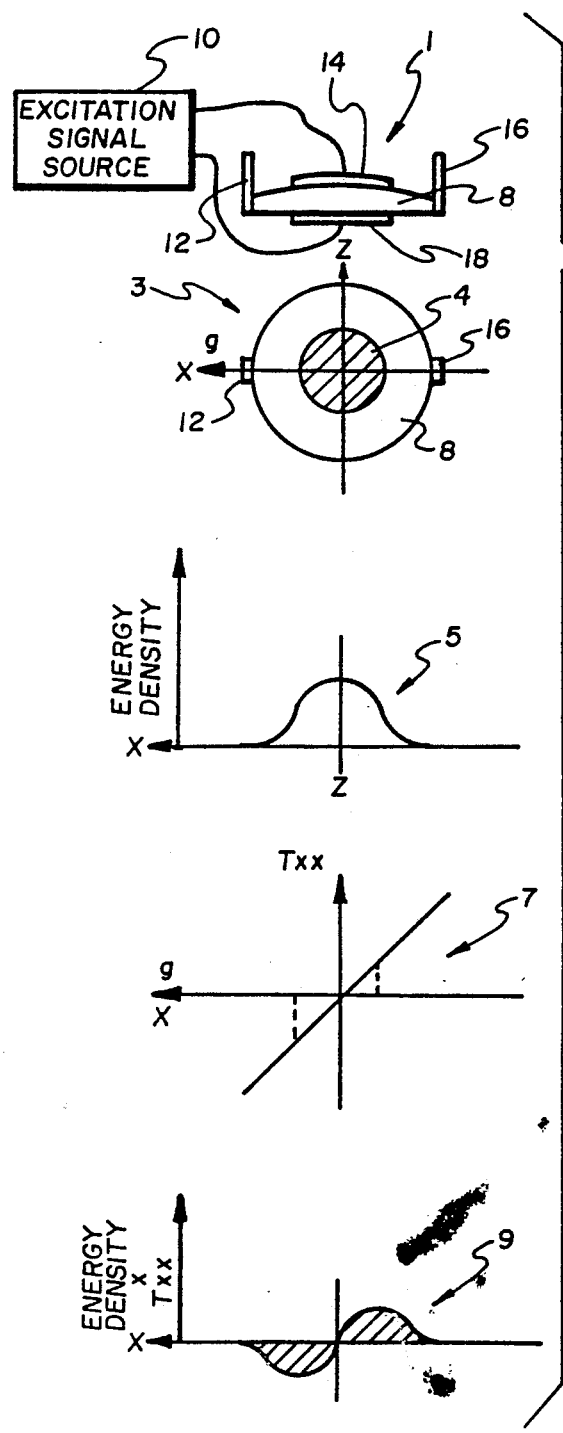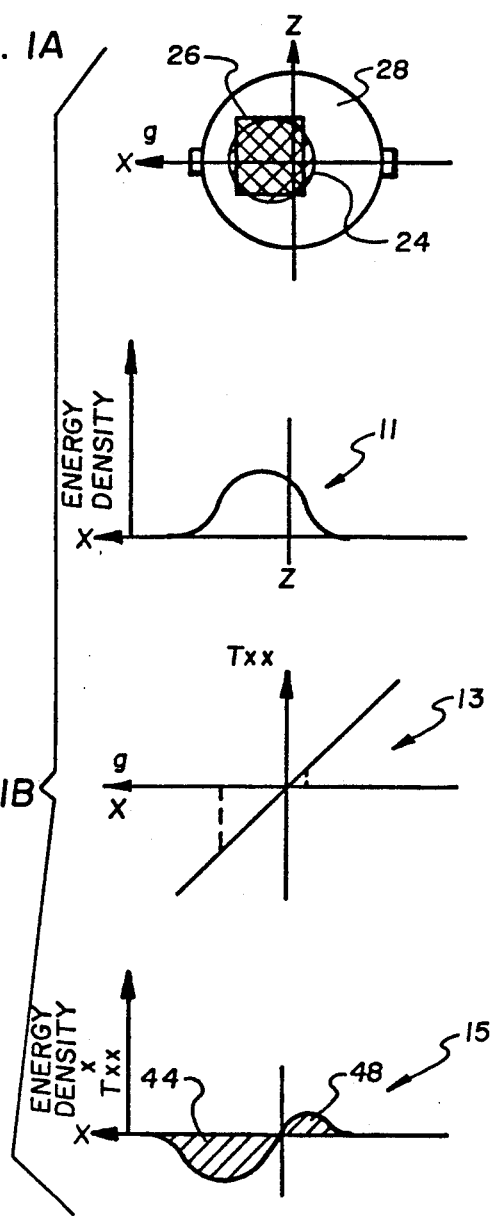
Fig. 1A
Fig. 1B

METHOD OF MANUFACTURING CRYSTAL RESONATORS HAVING LOW ACCELERATION SENSITIVITY

This is a division of application Ser. No. 07/218,282 filed Jul. 13, 1988, now U.S. Pat. No. 4,935,658, which in turn is a continuation-in-part of applications Ser. No. 103,670, filed Oct. 2, 1987, now U.S. Pat. No. 4,837,475.

BACKGROUND OF THE INVENTION

This invention relates to crystal resonators manufactured to control their acceleration sensitivity.

Piezoelectric quartz crystal resonators have long been employed to develop highly accurate timing signals for such applications as communications, navigation and radar. In particular, resonant frequencies of thickness shear mode quartz resonators are commonly used as timing standards in crystal-controlled oscillators.

In spite of the relative stability and precision of the frequency output of such quartz resonator controlled oscillators, frequency shifts and thus timing errors can occur when the resonator is subjected to acceleration (or gravity) caused stresses. These stresses are produced in the resonator as a result of interaction between the crystal element and its mounting or holding structure. Investigations have generally been unsuccessful in identifying effects, or whether there is any effect, of various parameters (crystal geometry, angle of cut, temperature, etc.) on acceleration sensitivity (see Filler et al "Further Studies on the Acceleration Sensitivity of Quartz Resonators", Proc. 37th Annual Symposium on Frequency Control 1983, pp. 265-271; and Filler, Raymond L., "The Acceleration Sensitivity of Quartz Crystal Oscillators: A Review", Proc. 41st Annual Symposium on Frequency Control, 1987, pp. 398-408.) Vig et al, U.S. Pat. No. 4,451,755, does suggest some dependence of acceleration sensitivity on the radius of curvature of convex surfaces of a crystal. In a related co-pending patent application, EerNisse and Ward show that the position and/or shape of the active region of vibration of the crystal is an important factor in determining the acceleration sensitivity.

A resonator's sensitivity to acceleration has been defined by a so-called "gamma vector". The vector is composed of three frequency shift components which coincide with the x, y, & z mechanical (or geometric) axes of the crystal and which are measured for acceleration applied in directions corresponding to each of the axes. Once the gamma vector is known for a crystal, the frequency shift for any acceleration vector a can be obtained as the dot product of that vector a and the gamma vector.

It is desirable, of course, to reduce the magnitude of the gamma vector as much as possible to reduce acceleration-caused frequency error. But, as indicated, earlier, there has been little success in doing this in a practical and consistent manner. Crystals prepared and mounted in seemingly an identical fashion can, nevertheless, have different gamma vectors (in both direction and magnitude) for no apparent reason. The variation in gamma vector from resonator to resonator can be large or small; however, the more precise is the resonator fabrication and mounting geometry, the smaller is the vector deviation in magnitude and direction.

The earlier mentioned co-pending application showed that the gamma vector could be modified (normally reduced) by either moving the active region of vibration or changing its shape. This was done by adding or subtracting mass, or a combination of both, over selected areas of the resonator surface. In the case where the gamma vector changes significantly from resonator to resonator, it would be necessary to measure at least one component of the gamma vector in order to determine the required resonator mass modification. In the case of a tightly controlled manufacturing process where the gamma vectors are grouped closely together from resonator to resonator, measurement of the gamma vector for every resonator would be expensive for little additional benefit, since learning of the gamma vector for one resonator would provide a reasonable indication of the gamma vectors for the other similarly manufactured resonators.

It should be noted that crystal resonators used in frequency control are typically provided with their resonant frequency by "trimming" the resonators to preselected values. This trimming is carried out by adding mass uniformly over a crystal to lower the frequency to the desired level. Such addition of mass, however, has not been utilized to reduce the gamma vector or resonators.

SUMMARY OF THE INVENTION

It is an object of the invention to provide a crystal resonator manufactured to control its acceleration sensitivity.

It is also an object of the invention to provide a procedure for fabricating quartz resonators to reduce their acceleration sensitivity.

The above and other objects of the invention are realized in a specific illustrative embodiment of a resonator having a generally disk-shaped crystal element ("crystal"), or resonator "plate" held in place by two or more supports which contact or are integral with the crystal at or near its perimeter, and excitation apparatus. The resonator is manufactured using a process which results in the gamma vector having substantially the same magnitude and direction for each resonator made. Thus, once the gamma vector is determined for one resonator, it will generally be known for the other resonators. Then, the manufacturing process can be adapted to reduce the gamma vector or at least one component thereof and thus the acceleration sensitivity. Adding (or removing) bulk, such as gold or other metal, alloy, or compound in a thin sheet to the resonator surface changes the gamma vector. In particular, it has been found that by adding bulk to selected locations on the surface of the crystal, the shape and/or location of the active region of vibration of the crystal can be changed and thus the acceleration sensitivity (represented by the gamma vector) of the crystal can be effectively reduced. Removing material from the crystal may also be used to reduce the gamma vector (or component). Thus, for the manufacturing process in question, after the gamma vector is determined for one or more representative resonators, mass is added, removed, or redistributed (mass "location" changed but total mass remains the same) during the subsequent fabrication of resonators to reduce the gamma vector or at least one of its components. The gamma vector can also be reduced during a manufacturing process by the appropriate positioning of electrodes relative to the crystal either to adjust the mass distribution of the whole assembly or to selectively position the electric field for excitation of the crystal.

BRIEF DESCRIPTION OF THE DRAWINGS

The above and other objects, features and advantages of the invention will become apparent from a consideration of the following detailed description presented in connection with the accompanying drawings in which:

FIGS. 1A, 1B and 1C show respectively pictorial representations of an ideal, symmetrical active region of vibration of a crystal resonator, a non-symmetrical active region of vibration with respect to the z axis caused by bulk added off-center, and a distorted non-symmetrical region of vibration caused by bulk added off-center, together with graphs illustrating effects on the crystal;

DETAILED DESCRIPTION

Figure 1C:
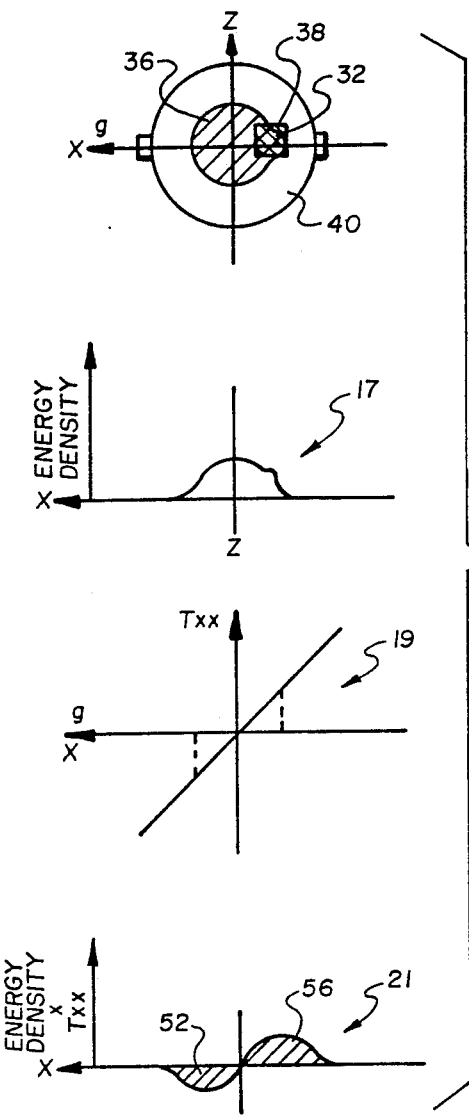

A quartz crystal resonating in the thickness shear mode contains an active region of vibration generally centered in the thickest part of the crystal element. Ideally, this active region would be symmetrical about the axes of the crystal, in which case the gamma vector would be the same from resonator to resonator (assuming the mounting structures for the resonators are constructed and deployed essentially the same).

FIG 1A gives a pictorial representation of an ideal, symmetrical active region of vibration 4 of a disk-shaped crystal or resonator plate 8 supported on opposite sides by mounting pins 12 and 16. (The crystal 8 is shown in side view at 1 and top, plan view at 3.) The crystal 8 is caused to vibrate in a conventional way by an excitation signal source 10 coupled by way of electrodes 14 and 18 to the crystal in a well known manner. The active region 4 (not to be confused with the electrode 14) is symmetrical about both the x and z axes, and the energy of vibration of this active region is illustrated by graph 5. If the mounting pins of the crystal are accelerated to the right or the crystal is subjected to gravity (g) pulling in the x direction to the left, stress forces are developed in the crystal—compression in the left half (because the crystal is being pushed against the support 12) and tension in the right half (because the crystal is being pulled away from the support 16). The stress components, negative for compression and positive for tension, are shown in graph 7. The shift in resonant frequency is related to the product of stress $T_{xx}$ and energy density averaged over the crystal volume. As can be seen in graph 9 of FIG. 1A, the positive and negative components of this product are equal but opposite in sign and so cancel leaving a net product of substantially zero.

Previous theoretical treatments of acceleration sensitivity assumed a perfectly centered vibration region, so such treatments neglected the contributions to acceleration sensitivity of $T_{xx}$, and any other stresses that have odd symmetry. It has been discovered, however, that these stresses can cause sizeable contributions to frequency shift if the vibration region is even only slightly off-center.

FIG. 1B is a pictorial representation of an active region of vibration 24 of a crystal or resonator plate 28, where the region is non-symmetrical with respect to the z axis. This lack of symmetry could be caused unintentionally during fabrication or intentionally by adding mass (such as patch 26 of FIG. 1B) off-center, i.e., off-center of the y axis which is normal to the resonator plate 28, or removing some of the crystal off-center. Actually, the active region 24 is shown as being symmetrical about the x axis, but not with respect to the z axis. Other types of distortion of the active region of vibration can also be made to occur as a result of added off-center mass or removal of crystal off-center; an example is shown in FIG. 1C where a lobe 32 is formed on one side of the active region 36 of a crystal 40 by adding an off-center thin film mass 38, giving rise to a non-symmetrical energy curve 17 as shown under the crystal.

Referring to FIG. 1B again, the energy density curve is non-symmetrical about the z axis as shown in graph 11. The stress forces $T_{xx}$ produced in the crystal 28, when the crystal 28 is subjected to a gravitational force g in the positive x direction (or is accelerated to the right), are shown in graph 13 of FIG. 1B. As shown in graph 15 of FIG. 1B, the product of energy density and stress averaged over the crystal volume is greater for compression (shown at 44) than for tension (shown at 48).

If a net compressive stress is applied along the x crystallographic direction of an AT-cut quartz crystal, the frequency of vibration of the crystal shifts to become greater (with net tensile stress, the frequency would decrease). Thus, if the geometric x axis of the FIG. 1B graph corresponds to the x crystallographic axis of the crystal, then with the asymmetrical region of vibration shown in FIG. 1B and the g force in the positive x direction, the resultant frequency error would be an increase in frequency. As a consequence, the contribution of stress $T_{xx}$ to the x component of the gamma vector would be positive if defined for gravity g acting from the positive x side. If the crystal were an SO-cut quartz crystal, or if it were made of a different material, such as Berlinite or $LiNbO_3$, there would still be a frequency shift induced by this off-center active region of vibration, the magnitude and sign of the frequency shift depending on the crystallographic orientation of the crystal with respect to the mounting pins.

Referring again to FIG. 1C, the energy density graph 17 shows a distortion on the negative x side which, for gravity (g) pulling to the left or acceleration to the right, gives rise to a net tensile (as opposed to compressive) stress as shown in graph 21 of FIG. 1C (area 56 is slightly larger than area 52). With a net tensile stress where the x geometric axis is aligned with the x crystallographic direction for an AT-cut quartz crystal 40, the frequency shift due to $T_{xx}$ would be a decrease in the frequency. In other words, the contribution of $T_{xx}$ to the x component of the gamma vector would be negative when defined for gravity (g) acting from the positive x side.

As an alternative to adding mass on the right side of the crystal 40 of FIG. 1C to produce asymmetry of the active region of vibration with respect to the z axis, mass may be removed from the left side. This removal could involve either removing a portion of the crystal surface or removing some of the electrode(s), both from the left side. Additionally, the mass may remain essentially the same, but be redistributed to effect a distortion (or correction). From this it is apparent that the shape and/or location of the active region of vibration may be controlled by altering the resonator mass in one or a combination of three ways—adding mass, subtracting mass or redistributing mass. Further, such altering generally is performed at locations on the crystal which are *not* centered on the y axis, i.e., that axis normal to the plane of the crystal.

Figure 2:
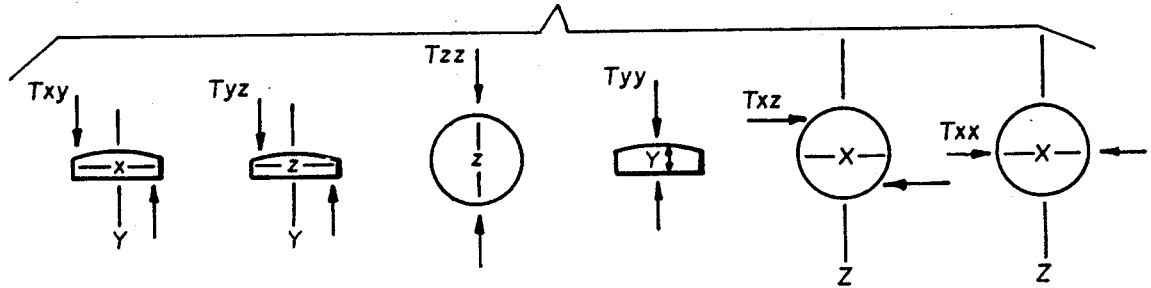
FIG. 2 shows pictoral representations of the six types of stress to which a crystal might be subjected and which would affect the gamma vector.

The above discussion considers only one stress component $T_{xx}$ which is the component of major concern for the specific acceleration forces considered in the FIGS. However, there are five other componets of stress in a crystal for g acting from the left (acceleration to the right) which might contribute to the gamma vector. Each of the stress components (illustrated in FIG. 2), which depend primarily on the shape of the crystal, the placement of the support pins, and the mechanical properties of the support pins, can be determined.

Figure 3A:
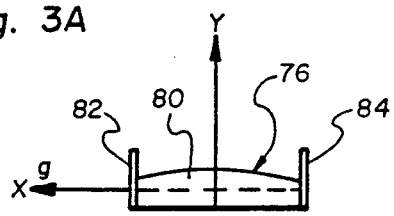
FIGS. 3A through 3F show a plano-convex crystal resonator subjected to acceleration and the resulting stress $T_{xy}$ effects in the crystal.
Figure 3C:
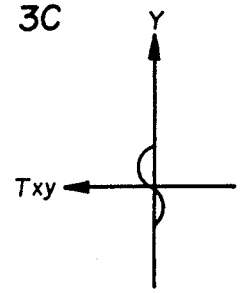
Figure 3B:
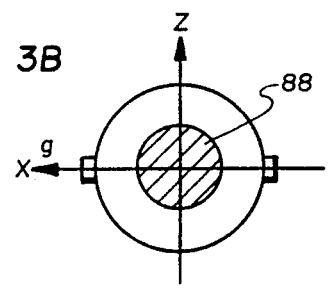
Figure 3D:
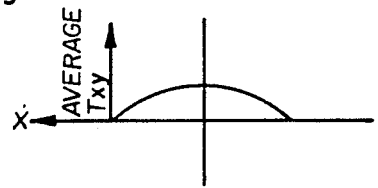
Figure 3E:
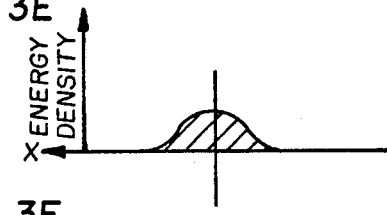
Figure 3F:
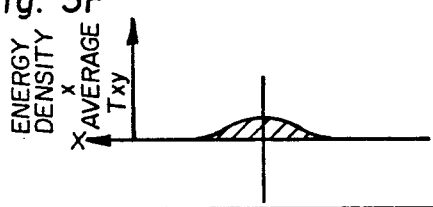

Some of the components of stress are not zero at the center of the crystal (i.e., do not have odd symmetry which could result in cancelling of forces), so shifting the vibration energy distribution has only a small effect on that stress component's contribution to the gamma vector. For example, FIGS. 3A and 3B illustrate a side view and top plan view of plano-convex crystal 76 accelerated again to the right or g acting form the left. This produces a shear stress $T_{xy}$, shown by graph in FIG. 3C, because the convex shape has a protruding portion 80 above the line of support provided by support pins 82 and 84. Thus, there is a net, or average value $T_{xy}$, shown in the graph of FIG. 3D, when averaged over the thickness (y axis) of the crystal 76. This "average $T_{xy}$" has even symmetry about the z axis as shown in FIG. 3D. The active region of vibration 88 (FIG. 3B) has even symmetry about the z axis as shown in FIG. 3E. Of course, there is still a net positive area of the product of "average $T_{xy}$" and energy density as seen in the graph of FIG. 3F. Thus, there will be a gamma vector component due to $T_{xy}$ no matter how symmetric the vibration energy density is. (However, reducing the contour of the convex surface will reduct $T_{xy}$.)

In some cases, perfect symmetry of the active region of vibration with respect to the physical geometry of the crystal or plate does not yield the smallest magnitude for the gamma vector. In other words, for some cases, the lowest acceleration sensitivity, i.e., smallest gamma vector, is obtained with the active region of vibration being slightly off-center. Obtaining the lowest acceleration sensitivity by moving the active region off-center (away from the geometric center of the crystal) would be achieved using methods already discussed. Specifically, if a particular manufacturing process produces finished devices with closely similar gamma vectors, that manufacturing process can be modified by intentionally adding mass or removing mass (or a combination of adding and removing mass) to move the active region of vibration off-center. Improvement occurs because the off-center position of the active region brings into play some of the effects of the odd-symmetry stress such as seen in FIG. 1B or 1C to compensate the even symmetry stress effect such as seen in FIGS. 3A through 3F. The exact amount of mass redistribution depends on the crystallographic orientation of the crystal (blank) and the stiffness, spacing, and crystallographic location of the mounting structure (to be discussed momentarily). Once the optimum location and amount of mass to be added, removed or redistributed is determined, the manufacturing process can be modified to include this change. A lower gamma vector will then be obtained.

Figure 4:
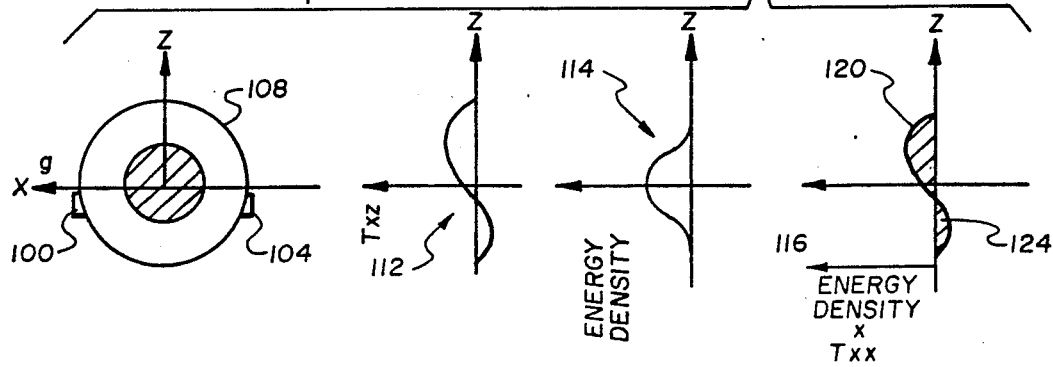
FIG. 4 shows a crystal resonator whose mounting pins are offset along the z axis with respect to the x axis, and the resulting stress $T_{xz}$ effects in the crystal resonator caused by acceleration forces.

Another source of non-zero stress at the crystal center is lack of symmetry of the mounting pins, such as in their positioning, or in their relative bending rigidities. Such lack of symmetry might be incorporated into a resonator design to improve shock ruggedness or alter structural resonance. In this case, the stress is non-symmetric, so even if the active region of vibraiton is symmetric, the product of stress and energy density has a non-zero net value. FIG. 4 shows one example—where the active region of vibration is symmetric about the x and z axes, but support pins 100 and 104 holding the crystal 108 are offset in the z axis direction. FIG. 4 shows in graph 112 the shear stress $T_{xz}$ due to the attraction of gravity from the left. Since the center of mass of the resonator is above the pin mounts, there is more overhang which causes more shear stress above the pins than below the pins. As seen in graph 116 of FIG. 4, the product of energy density 114 times shear stress (averaged over the crystal volume) shows a net area (area 120 under the curve greater than the other area 124). This can be corrected by appropriately adding (or subtracting) mass to the crystal to shift the location of the active region of vibration. Another approach is to remove some of the exterior of the crystal 108 to better disbribute the crystal mass with respect to the pins and thereby rearrange and redistribute the stress pattern in the crystal. Removal of a portion of the crystal could be accomplished by grinding, air abrasive, or other known methods. Finally, mass can be added and then some selectively removed. Gold has been mentioned as a type of material which could be added, but other materials could also be used including insulator material such as silicon dioxide.

It is conceivable that alack of symmetry in the mounting structure such as in FIG. 4 could be used to shift the stress pattern to particularly advantageous configurations. For instance, the stress pattern might be shifted to bring into play some of the odd symmetry stress components while maintaining the active region of vibraiton in the geometric center. The stress pattern might be shifted to augment the odd symmetry stress so that shifting of the active region of vibration by reason of a msss change has a more pronounced effect.

Besides adding, subtracting or redistributing mass, the location and/or shape of the active region of vibration can also be affected by the electric field produced by the electrodes of the devices. In particular, the active region of vibration has some tendency to move to the region of highest or strongest driving electric field because of the so-called piezoelectric stiffness effects. This phenomenom mey be utilized to control the shape or location of the active region of vibration and would be especially useful with lateral field resonators (see U.S. Pat. No. 4,701,661) where the electrodes are not positioned over the active region of vibration of the crystal. The reason for this is that the electrodes can be moved to affect the location and shape of the active region of vibration—by way of changing the location of the electric field—but since the electrodes are not positioned over the active region of vibration of the crystal, no change in mass distribution in the active region of vibration of the device occurs which might otherwise dramatically affect the location of the active region in an undesirable fashion. The electric field can be modified by techniques in addition to moving the electrodes, for example, by changing the shape of the electrodes and by changing the crystallographic orientation of the electrodes.

Figure 5A:
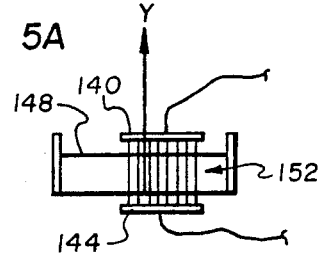
FIG. 5 shows a crystal resonator whose electrodes are not in contact with the crystal and are off-center so that the region of vibration is off-center.
Figure 5B:
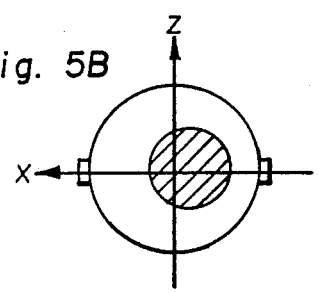

Another resonator configuration for which the piezoelectric stiffening effect can be used advantageously to reduce the gamma vector is a resonator design where there are no electrodes directly on the crystal. For example, in FIG. 5A, electrodes 140 and 144 are located closely above and below the crystal 148 to generate an electric field 152 in the crystal. By moving one or both of these electrodes off-center with respect to the y axis (as shown in FIG. 5A), or by tilting one or both of the electrodes, the active region of vibration (such as region 156 of FIG. 5B) can be moved or its shape changed. Of course, by controlling the location and shape of the active region of vibration, the gamma vector can be reduced.

In the manner described, a manufacturing process which produces quartz crystal resonators having substantially the same gamma vectors may be modified to reduce the gamma vector and thus the sensitivity of the resonators to gravity and acceleration. In particular, the manufacturing process may be modified to change the ultimate shape of the resonator by adding bulk such as by thin film deposition, by removing bulk such as by abrading or grinding the crystal in selected areas, or by adding material and then removing selected portions, to thereby reduce the gamma vector. Also, the resonator electrodes may be moved or otherwise modified to change the electric field and thus reduce the gamma vector. Additionally, the symmetry of the mounting structure for the crystal can be modified to move the stress pattern to thereby reduce the gamma vector.

It is to be understood that the above-described arrangements are only illustrative of the application of the principles of the present invention. Numerous modifications and alternative arrangements may be devised by those skilled in the art without departing from the spirit and scope of the present invention. For example, mass might be added to a crystal by anodization, sputtering, evaporation, oxidation, plating, painting, glueing, and alloying, all of which are well known, and ion milling, chemical etching, grinding with an abrasive, laser cutting, fluid cutting, plasma etching, reactive ion etching, air abrading with an abrasive, and selectively contouring may be employed to remove mass. combinations of the above may be used to redistribute mass in order to reduce the gamma vector while achieving a desired final resonent frequency. The appended claims are intended to cover such modifications and arrangements.

What is claimed is:

1. In a process of manufacturing crystal resonators in which the gamma vector magnitude and direction, and the location of the active region of vibration, are generally the same for each resonator manufactued, a method of reducing the gamma vector and thus the acceleration sensitivity comprising
producing a first resonator having a piezoelectric crystal, and excitation means for causing said crystal to resonate with an active region of vibration,
providing support structure for the crystal, measuring at least one component of the gamma vector of said first resonator, determining a resonator mass modification required to reduce at least one component of the gamma vector and thus the acceleration sensitivity, and altering the proceses to change the mass of each resonator produced in accordance with the determined required modification.

2. A method as in claim 1 wherein said altering step comprises depositing material on a selected surface area of the resonator.

3. A method as in claim 2 wherein said altering step comprises applying a thin film of material to a selected surface area of the resonator to thereby reduce the acceleration sensitivity.

4. A method as in claim 3 wherein said applying step comprises at least one operation selected from the following group:
evaporation;
oxidation;
plating;
painting;
glueing;
alloying;
sputtering;
anodization.

5. A method as in claim 3 wherein said thin film of material is gold.

6. A method as in claim 3 wherein said thin film of material is silicon dioxide.

7. A method as in claim 1 wherein said altering step comprises removing some of the crystal from a selected area to thereby move the active region of vibration and reduce the acceleration sensitivity.

8. A method as in claim 1 wherein at least a portion of said excitation means is placed in contact with said crystal, and wherein said altering step comprises removing some mass ofthe excitation means which is in contact with the crystal to thereby move the active region of vibration and reduce the acceleration sensitivity.

9. A method as in claims 7 or 8 wherein said removing step comprises at least one operation selected from the following group:
grinding with an abrasive;
chemical etching;
laser cutting;
fluid cutting;
ion milling;
reactive ion etching;
plasma etching;
air abrading with an abrasive.

10. A method as in claim 1 wherein said altering step comprises at least one operation selected from the following group to move the active region of vibration:
adding material to said resonator at a selected location;
removing material from a selected location of said resonator;
redistributing the mass of the resonator to thereby reshape the resonator.

11. A method as in claimn 1 wherein said altering step comprises
applying material to a portion of the surface area of the resonator, and
removing selected portions of the material to thereby reduce the acceleration sensitivity.

12. A method as in claim 1 wherein said excitation means includes electrodes fixed to said crystal and wherein said altering step comprises removing a selected portion of an electrode to thereby reduce the acceleration sensitivity.

13. In a process of manufacturing crystal resonators involving the steps of producing resonators, each having a resonator plate and excitation means for causing said resonator plate to resonate with an active region of vibraiton, and providing a support structure for the resonator plates, so that the magnitude and direction of the gamma vector of the resonator is generally the same for each resonator manufactured, the improvement comprising a method of reducing at least one component of the gamma vector to thereby reduce the acceleration sensitivity, said method including the step of altering the resonator construction to thereby change the location of the geometric center of the active region of vibration of the resonator by an amount determined by the magnitude and direction of the gamma vector thereby reducing at least one component of the gamma vector.

14. A method as in claim 13 wherein said altering step comprises altering the resonator center of mass off-center of the geometric y axis of the resonator plate to thereby reduce at least one component of the gamma vector.

15. A method as in claim 14 wherein said altering step comprises applying material to a selected surface area of the resonator off-center of the y axis of the resonator plate to thereby reduce the acceleration sensitivity.

16. A method as in claim 14 wherein said altering step comprises removing mass from a selected area of the resonator off-center of the y axis of the resonator plate to thereby reduce the acceleration sensitivity.

17. A method as in claim 14 wherein said altering step comprises
applying material to a portion of the surface area of the resonator, and
removing selected portions of the material off-center of the y axis of the resonator plate to thereby reduce the acceleration sensitivity.

18. A method as in claim 13 wherein said excitation means includes electrodes positioned above and below the resonator plate, and wherein said altering step comprises positioning at least one of the electrodes so that the area of greatest strength of the electric field is positioned off-center of the y axis of the plate to thereby reduce at least one component of the gamma vector.

* * * * *